United States Patent
Shin et al.

(10) Patent No.: US 7,859,851 B2
(45) Date of Patent: Dec. 28, 2010

(54) FLEXIBLE PRINTED CIRCUIT AND BRACKET STRUCTURE FOR HARD DISK DRIVE

(75) Inventors: Sang-chul Shin, Osan-si (KR); Byoung-gyou Choi, Suwon-si (KR); Jeong-seon Kim, Suwon-si (KR); Jun-young Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1099 days.

(21) Appl. No.: 11/296,265

(22) Filed: Dec. 8, 2005

(65) Prior Publication Data

US 2006/0126217 A1 Jun. 15, 2006

(30) Foreign Application Priority Data

Dec. 9, 2004  (KR) ............... 10-2004-0103632

(51) Int. Cl.
*H05K 1/00* (2006.01)
(52) U.S. Cl. .................... 361/749; 174/250
(58) Field of Classification Search ............ 174/250, 174/72 A; 361/749, 685, 748; 360/97.01, 360/137, 73.03
See application file for complete search history.

(56) References Cited

U.S. PATENT DOCUMENTS 7,227,717 B1 * 6/2007 Schreck et al. ........... 360/97.01
7,420,771 B1 * 9/2008 Hanke et al. ............. 360/97.01
2006/0232878 A1 * 10/2006 Saruta .................... 360/97.01
2008/0068757 A1 * 3/2008 Kamigama et al. ....... 360/245.3

FOREIGN PATENT DOCUMENTS

| JP | 05-074122 | | 3/1993 |
|---|---|---|---|
| JP | 2003-100070 | | 4/2003 |
| JP | 2003100070 | * | 4/2003 |
| KR | 1995-030046 | | 11/1994 |
| KR | 1997-055907 | | 10/1997 |
| KR | 1998-012239 | | 5/1998 |
| KR | 10-2000-0017255 | | 3/2000 |

* cited by examiner

*Primary Examiner*—Jinhee J. Lee
*Assistant Examiner*—Yuriy Semenenko
(74) *Attorney, Agent, or Firm*—Staas & Halsey LLP

(57) ABSTRACT

A flexible printed circuit board and a bracket structure for the hard disk drive. The flexible printed circuit board includes a base layer, a circuit layer provided on the base layer, a cover layer provided on the circuit layer, and a filter layer interposed between the base layer and the circuit layer. Also, the bracket structure includes a flexible printed circuit board for driving an actuator, a bracket connected to the flexible printed circuit board, and a filter interposed between the flexible printed circuit board and the bracket. Thermal asperity caused by fine particles in the hard disk drive is prevented so that performance deterioration of the hard disk drive is prevented and reliability thereof is improved.

6 Claims, 3 Drawing Sheets

FLEXIBLE PRINTED CIRCUIT AND BRACKET STRUCTURE FOR HARD DISK DRIVE

CROSS-REFERENCE TO RELATED APPLICATION

This application claims the benefit of Korean Patent Application No. 10-2004-0103632, filed on Dec. 9, 2004, in the Korean Intellectual Property Office, the disclosure of which is incorporated herein by reference.

BACKGROUND OF THE INVENTION

1. Field of the Invention

The present invention relates to a flexible printed circuit board and a bracket structure for a hard disk drive, and more particularly, to a flexible printed circuit board having a filter and a bracket structure.

2. Description of Related Art

A hard disk drive (HDD) is a memory unit to read data from a disk or write data to the disk using a read/write head. During operation of the hard disk drive, the read/write head is moved to a desired position by an actuator while being floated a certain distance above a recording surface of the disk.

The actuator is driven by a flexible printed circuit connected to a bracket, which will be described in detail with reference to FIG. 1.

FIG. 1 is a plan view of a conventional hard disk drive including a CSS (contact start stop) type head parking system.

Referring to FIG. 1, the hard disk drive includes a magnetic disk (hard disk) 20 which is a recording medium for recording data, a spindle motor 30 installed to a base member 10 for spinning the disk 20, an actuator 40 having a read/write head 41 for writing data to the disk 20 and reading the data from the disk 20, and a flexible printed circuit member 60 for driving the actuator 40.

A plurality of disks 20 are generally spaced apart from each other, and are rotated by the spindle motor 30. The disk 20 is provided with a parking zone 21 on an inner periphery of the disk. When a power is turned off, a slider 42 with the read/write head 41 mounted thereon is seated on the parking zone 21. A data zone 22 to be recorded with data is provided on an outside of the parking zone 21.

The actuator 40 includes a swing arm 46 pivoting around a pivot 47 installed on the base member 10. A suspension 44 is installed to one end of the swing arm 46 for elastically biasing the slider 42 with the read/write head 41 mounted thereon against a surface of the disk.

The actuator 40 is rotated by a voice coil motor (VCM) 50. The voice coil motor 50 includes a VCM coil 56 connected to the other end of the swing arm 46. Magnets (not shown) are disposed at upper and lower portions of the VCM coil 56 to be opposite to each other.

In the conventional hard disk drive configured as described above, a lift force caused by air flow generated by rotation of the disk 20 and an elastic force of the suspension 44 act on the slider 42 with the read/write head 41 mounted thereon, during writing or reading data. As such, the slider 42 is floated on the data zone 22 of the disk at a height at which the lift force and the elastic force are in balance. The head 41 mounted on the slider 42 writes the data to the disk 20 and reads the data from the disk 20, while the slider 42 is spaced apart from the rotating disk 20 at a constant interval.

The flexible printed circuit member 60 includes a flexible printed circuit board 70 for driving the actuator 40, and a bracket 61 supporting the flexible printed circuit board 70. The flexible printed circuit member 60 also includes a connector and a gasket.

The flexible printed circuit board 70 includes a conductive metal layer, a base layer, a circuit layer, and a cover layer, which are sequentially deposited, with an adhesive layer being interposed between the respective layers to adhere the layers. The connector is soldered to the flexible printed circuit board 70, and the gasket seals a space between the flexible printed circuit board 70 and the bracket 61.

The conductive metal layer reduces electromagnetic interference (EMI) against a bottom surface of the flexible printed circuit 70, and prevents deformation of the flexible printed circuit 70 during baking.

The circuit layer is provided with various circuits required for driving the actuator 40. In order to reduce a manufacturing cost and simplify a manufacturing process, after the circuit layer with circuits thereof interconnected is manufactured, the circuits are typically cut by mechanical punching so that the respective circuits are separated from one another. External air flows in the hard disk drive through holes formed by the punching.

Since the conventional hard disk drive is not provided with a unit for filtering the external air, fine dust particles contained in the air flow in the drive. The fine dust particles flowing in the drive adhere to the read/write head and the disk or float in an interior of the drive. As such, the fine dust particles cause thermal asperity (TA). According to the thermal asperity, fine particles held between the head and the disk cause friction between the head and the disk, so that the temperatures of the head and disk are abruptly raised to several hundreds degrees centigrade for a very short time. If the temperatures of the head and disk are raised, physical properties of the head and disk are varied, and scratch is generated on the disk. As a result, the performance of the hard disk drive is deteriorated. Therefore, it is necessary to eliminate the fine particles.

BRIEF SUMMARY

An aspect of the present invention provides a flexible printed circuit board and a bracket structure for a hard disk drive, in which fine particles contained in air flowing in an interior of the hard disk drive are filtered to prevent thermal asperity, preventing performance deterioration of the hard disk drive and improving reliability thereof.

According to an aspect of the present invention, there is provided a flexible printed circuit board for a hard disk drive comprising: a base layer; a circuit layer provided on the base layer; a cover layer provided on the circuit layer; and a filter layer interposed between the base layer and the circuit layer.

The filter layer may closely adhere to the base layer.

A conductive metal layer may be disposed under the base layer.

According to another aspect of the present invention, there is provided a bracket structure for a hard disk drive including a flexible printed circuit board for driving an actuator and a bracket connected to the flexible printed circuit board, the bracket structure comprising a filter interposed between the flexible printed circuit board and the bracket.

The filter may be closely adhered to the bracket.

The flexible printed circuit board may comprise a base layer, a circuit layer provided on the base layer, and a cover layer provided on the circuit layer, and the filter layer is further provided between the base layer and the circuit layer.

The filer layer may be closely adhered to the base layer.

The filer layer may be closely adhered to the circuit layer.

A conductive metal layer may be further provided under the base layer.

The bracket may comprise a filter seating portion on which the filter is seated.

The filter seating portion may be formed with at least one hole through which air flows.

According to another embodiment of the present invention, there is provided a flexible printed circuit housing including: a bracket supporting a flexible printed circuit board; a gasket coupled to the bracket and preventing air from passing between the bracket and the flexible printed circuit board; and a filter disposed between the bracket and the flexible printed circuit board. The bracket includes a filter seating portion on which the filter is seated, the filter seating portion has at least one hole defining an air flow path through the bracket and directing air to the filter so as to filter the air before the air reaches the flexible printed circuit board.

According to another embodiment of the present invention, there is provided a method of preventing contamination of a flexible printed circuit board supported by a bracket, the method including: seating a filter on a seating portion of the bracket, the bracket having at least one hole defining an air flow path through the bracket; and coupling a gasket to the bracket to block air from flowing between the bracket and the flexible printed circuit board.

Additional and/or other aspects and advantages of the present invention will be set forth in part in the description which follows and, in part, will be obvious from the description, or may be learned by practice of the invention.

BRIEF DESCRIPTION OF THE DRAWINGS

The above and/or other aspects and advantages of the present invention will become apparent and more readily appreciated from the following detailed description, taken in conjunction with the accompanying drawings of which:

FIG. 3 is a cross-sectional view illustrating a state in which the flexible printed circuit board and the bracket structure in FIG. 2 is coupled.

DETAILED DESCRIPTION OF EMBODIMENTS

Figure 1:
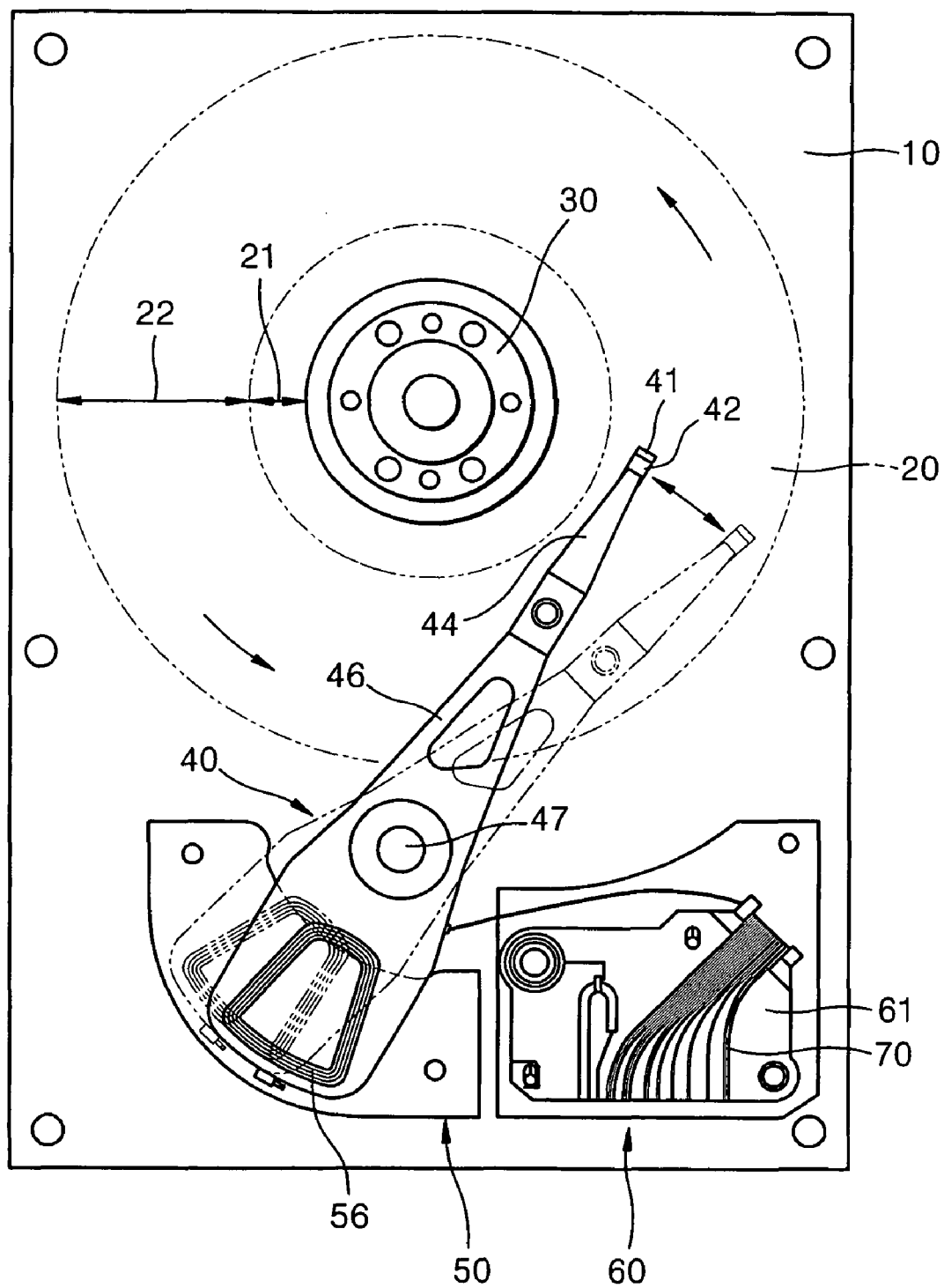
FIG. 1 is a plan view illustrating a conventional hard disk drive.

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 2:
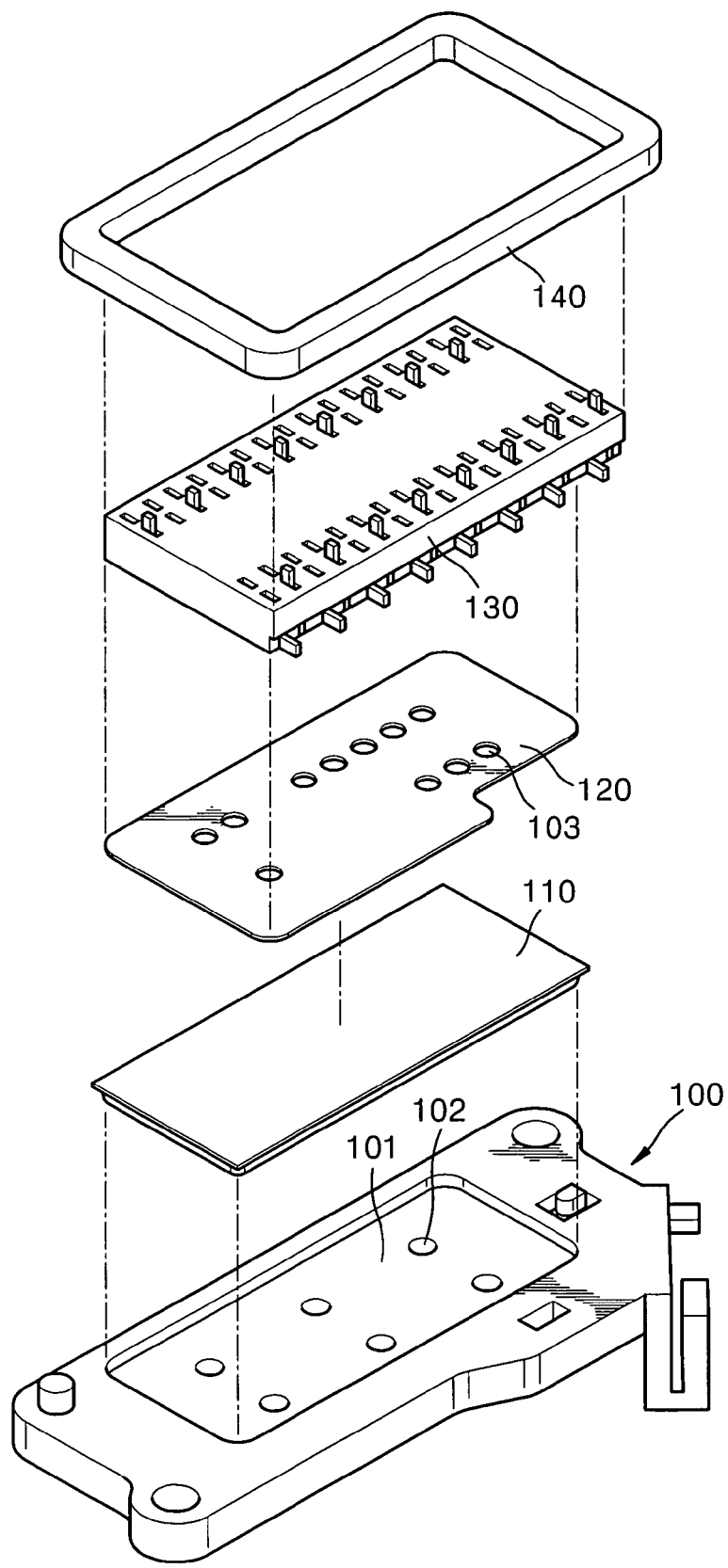
FIG. 2 is an exploded perspective view illustrating a flexible printed circuit board and a bracket structure for a hard disk drive according to an embodiment of the present invention.
Figure 3:
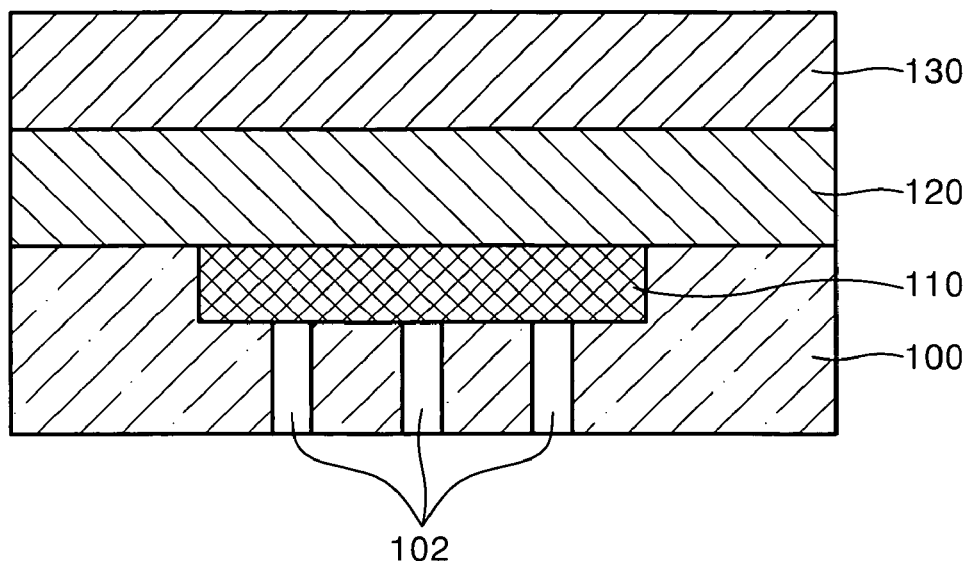
FIG. 3 is a cross-sectional view illustrating a state in which the flexible printed circuit board and the bracket structure in FIG. 2 are coupled.

FIG. 2 is an exploded perspective view illustrating a flexible printed circuit and a bracket structure for a hard disk drive according to an embodiment of the present invention. FIG. 3 is a cross-sectional view illustrating a state in which the flexible printed circuit and the bracket structure in FIG. 2 is coupled.

Referring to FIGS. 2 and 3, the hard disk drive according to an embodiment of the present invention includes a bracket 100, a filter 110, a flexible printed circuit board 120, and a connector 130, which are sequentially provided on the bracket 100. A gasket 140 is coupled to the bracket 100 to prevent air from passing between the bracket 100 and the flexible printed circuit board 120. Reference numeral 103 indicates a punching hole formed by mechanical punching.

The bracket 100 supports the flexible printed circuit board 120, and the flexible printed circuit board 120 is connected to an actuator (not shown) to drive the actuator.

According to the present embodiment, the bracket 100 is formed with a filter seating portion 101 on which the filter 101 is seated, and the filter 110 is disposed on the filter seating portion 101. The filter seating portion 101 is formed with at least one hole 102 serving as an air flow path.

Preferably, the filter 110 is closely adhered to the bracket 100 by, for example, an adhesive to prevent the inflow air from being not passing through the filter 110. A space between the flexible printed circuit board 120 and the bracket 100 is sealed by the gasket 140.

With the above construction, the air coming into the hard disk drive passes through the at least one hole 102 and the filter 110. Then, the fine particles contained in the air are filtered by the filter 110. Although the air passing through the filter 110 comes into the interior of the hard disk drive, the fine particles contained in the air are eliminated, so as not to affect the internal components of the hard disk drive. As a result, thermal asperity caused by the fine particles contained in the inflow air is significantly reduced in the hard disk drive.

A flow rate of the air flowing in the flexible printed circuit board 120 may be adjusted by changing the number and size of the at least one hole 102 or altering filtering performance of the filter 110.

According to the present embodiment shown in FIGS. 2 and 3, the filter 110 is disposed on the filter seating portion 101 and the filter 110 is disposed between the bracket 100 and the flexible printed circuit board 120. Therefore, before the air reaches the flexible printed circuit board 120, the fine particles contained in the air are eliminated by the filter 110, thereby preventing performance deterioration of the flexible printed circuit board 120 due to the particles.

The filter 110 is seated on the filter seating portion 101 in this embodiment, but it is merely illustrated as an example. Alternatively, the filter 110 may be seated on the upper portion of the bracket 100 and the flexible printed circuit board 120 is seated on the filter 110. That is, the filter 110 is seated on the upper portion of the bracket 100 without the filter seating portion 101 and the flexible printed circuit board 120 is seated on the filter 110.

Figure 4:
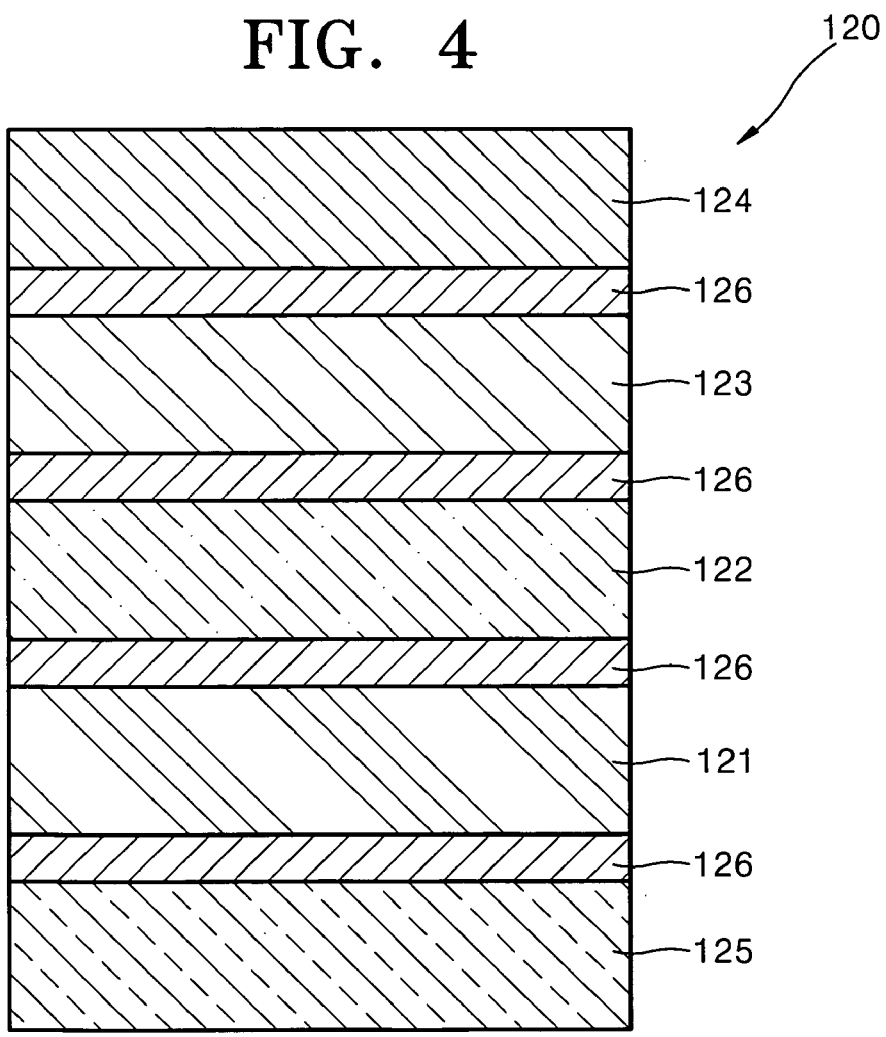
FIG. 4 is a vertical cross-sectional view illustrating a flexible printed circuit board for a hard disk drive according to another embodiment of the present invention.

FIG. 4 is a vertical cross-sectional view illustrating a flexible printed circuit board.

Referring to FIG. 4, a flexible printed circuit board 120 for the hard disk drive according to another embodiment of the present invention includes a base layer 121, a filter layer 122, a circuit layer 123, a cover layer 124, which are sequentially provided on the base layer 121, and a conductive metal layer 125 disposed under the base layer 121. An adhesive layer 126 is interposed between the respective layers to adhere the layers. This layering sequence is illustrated as a mere example, and the present invention is not limited thereto.

The base layer 121 and the cover layer 124 support and protect the circuit layer 123. The conductive metal layer 125 reduces electro-magnetic interference (EMI) of the flexible printed circuit board 120, and prevents deformation of the flexible printed circuit board during baking.

The circuit layer 123 is provided with various circuits required for driving an actuator (not shown). In order to reduce a manufacturing cost and simplify a manufacturing process, after the circuit layer with circuits thereof interconnected is manufactured, the circuits may be cut by mechanical punching.

According to the present embodiment shown in FIG. 4, the flexible printed circuit board 120 includes the filter layer 122 therein. With the construction, the air coming into the hard disk drive through the punching hole formed by the mechanical punching passes through the filter layer 122, so that the fine particles contained in the air are filtered. Accordingly, the fine particles contained in the air do not reach the interior of the hard disk drive, thereby significantly reducing the thermal asperity in the hard disk drive.

In addition, according to the present embodiment shown in FIG. 4, the filter layer 122 is disposed under the circuit layer 123. That is, the filter layer 122 is provided between the base layer 121 and the circuit layer 123. The filter layer 122 closely adheres to at least one of the base layer 121 and the circuit layer 123 to prevent fine dust in the input air from arriving at the circuit layer 123. Hence, the fine particles contained in the air do not reach the circuit layer 123, on which various circuits for driving the major components of the hard disk drive such as actuator are formed, thereby preventing malfunction of the circuit layer 123 caused by the fine particles. In the present embodiment shown in FIG. 4, the additional filter 110 may not be installed on the flexible printed circuit board 120, unlike the flexile printed circuit board 120 according to the embodiment shown in FIGS. 2 and 3.

Also, the filter layer 122 of the flexible printed circuit board 120 according to the embodiment shown in FIG. 4 can be provided between the circuit layer 123 and the cover layer 124. The additional filter 110 is provided on the lower portion of the flexible printed circuit board 120 as shown in FIGS. 2 and 3.

According to the flexible printed circuit board and the bracket structure for the hard disk drive according to the above-described embodiment of the present invention, since the flexible printed circuit board and the bracket are provided with the filter, the fine particles contained in the air flowing in the hard disc drive are filtered. As a result, the thermal asperity caused by the fine particles in the hard disk drive can be prevented, thereby preventing performance deterioration of the hard disk drive and improving reliability thereof.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A bracket structure for a hard disk drive including a flexible printed circuit board for driving an actuator and a bracket connected to the flexible printed circuit board, the bracket structure comprising:
   a filter interposed between the flexible printed circuit board and the bracket,
   wherein the flexible printed circuit board comprises
   a base layer,
   a circuit layer provided on the base layer,
   a cover layer provided on the circuit layer to protect the circuit layer, and
   a filter layer interposed between the base layer and the circuit layer to filter particles contained in air passing through the filter layer, and
   wherein the bracket comprises a filter seating portion on which the filter is seated,
   wherein the filter seating portion is formed with at least one hole through which air flows, the at least one hole is formed vertically through the bracket, and the filter covers the at least one hole.

2. The bracket structure according to claim 1, wherein the filter is closely adhered to the bracket.

3. The bracket structure according to claim 1, wherein the filter layer is closely adhered to the base layer.

4. The bracket structure according to claim 1, wherein the filter layer is closely adhered to the circuit layer.

5. The bracket structure according to claim 1, wherein a conductive metal layer is further provided under the base layer.

6. The bracket structure according to claim 1, wherein the filter seating portion has a groove shape formed on upper surface of the bracket.

* * * * *